(12) United States Patent
Hattangadi et al.

(10) Patent No.: US 11,632,871 B2
(45) Date of Patent: Apr. 18, 2023

(54) MECHANICAL SYSTEM FOR ENABLING SCALABLE SERVER SYSTEM

(71) Applicant: Atos Global IT Solutions and Services Private Limited, Navi Mumbai (IN)

(72) Inventors: Amit Hattangadi, Bengaluru (IN); Sakthivel Mohanasundaram, Thanjavur (IN); Jithendra Bangera, Bangalore (IN); Sanjayakumar Halli, Gadag (IN); Vishwas Bs, Bangalore (IN); Mohanakumara Prakasha, Belur (IN); Sriprada Adiga, Bangalore (IN); Shubham Kumbhar, Bangalore (IN)

(73) Assignee: BULL SAS, Les Clayes sous Bois (FR)

( * ) Notice: Subject to any disclaimer, the term of this patent is extended or adjusted under 35 U.S.C. 154(b) by 0 days.

(21) Appl. No.: 17/485,275

(22) Filed: Sep. 24, 2021

(65) Prior Publication Data
US 2022/0104380 A1    Mar. 31, 2022

(30) Foreign Application Priority Data
Sep. 30, 2020    (EP) .................................... 20199427

(51) Int. Cl.
*H05K 7/14*    (2006.01)
(52) U.S. Cl.
CPC ......... *H05K 7/1445* (2013.01); *H05K 7/1418* (2013.01); *H05K 7/1452* (2013.01); *H05K 7/1491* (2013.01)
(58) Field of Classification Search
CPC .. H05K 7/1445; H05K 7/1418; H05K 7/1452; H05K 7/1491; H05K 7/1492; G06F 1/181; G06F 1/183; G06F 2200/1635
See application file for complete search history.

(56) References Cited

U.S. PATENT DOCUMENTS

| | | | |
|---|---|---|---|
| 6,078,503 A | 6/2000 | Gallagher et al. | |
| 7,408,771 B2 * | 8/2008 | Chen ...................... | G06F 1/187 361/679.33 |

(Continued)

FOREIGN PATENT DOCUMENTS

EP    3254540    12/2020

OTHER PUBLICATIONS

European Search Report issued in EP20199427, dated Mar. 15, 2021(7 pages).

*Primary Examiner* — Anthony Q Edwards
*Assistant Examiner* — Hung Q Dang
(74) *Attorney, Agent, or Firm* — Arc IP Law, PC; Joseph J. Mayo

(57) ABSTRACT

A scalable system for high-power computer, comprising a plurality of motherboard chassis, inserted in a computer rack mounting kit, each motherboard chassis, being configured to receive at least one motherboard module, said plurality of inner chassis forming a stack of inner chassis, the stack being configured to receive an outer floating bracket chassis, said outer chassis being inserted by a second longitudinal end of each inner chassis forming the stack of inner chassis, each said outer floating bracket chassis being configured to accommodate at least one double floating bracket being configured to house a cable box capable of connecting the connectors of a plurality of motherboard modules, arranged in said inner chassis of the stack, to each other, the system being characterized in that the double floating bracket comprises at least several floating attachment means.

11 Claims, 9 Drawing Sheets

(56) References Cited

U.S. PATENT DOCUMENTS

| | | | |
|---|---|---|---|
| 7,542,279 B2* | 6/2009 | Chen | G06F 1/187 |
| | | | 361/825 |
| 8,422,217 B2* | 4/2013 | Xia | G11B 33/126 |
| | | | 361/679.41 |
| 2005/0094369 A1* | 5/2005 | Chen | G06F 1/187 |
| 2007/0153466 A1* | 7/2007 | Chen | G06F 1/187 |
| | | | 361/679.31 |
| 2007/0235625 A1* | 10/2007 | Liang | G06F 1/187 |
| 2008/0000849 A1* | 1/2008 | Zhang | G11B 33/123 |
| | | | 211/26.2 |
| 2010/0014258 A1* | 1/2010 | Fan | G06F 1/187 |
| | | | 361/732 |
| 2011/0069461 A1 | 3/2011 | Childs | |
| 2011/0075348 A1* | 3/2011 | Li | G11B 33/128 |
| | | | 361/679.33 |
| 2015/0289405 A1 | 10/2015 | Stewart et al. | |
| 2018/0192535 A1 | 7/2018 | Hofmann et al. | |

* cited by examiner

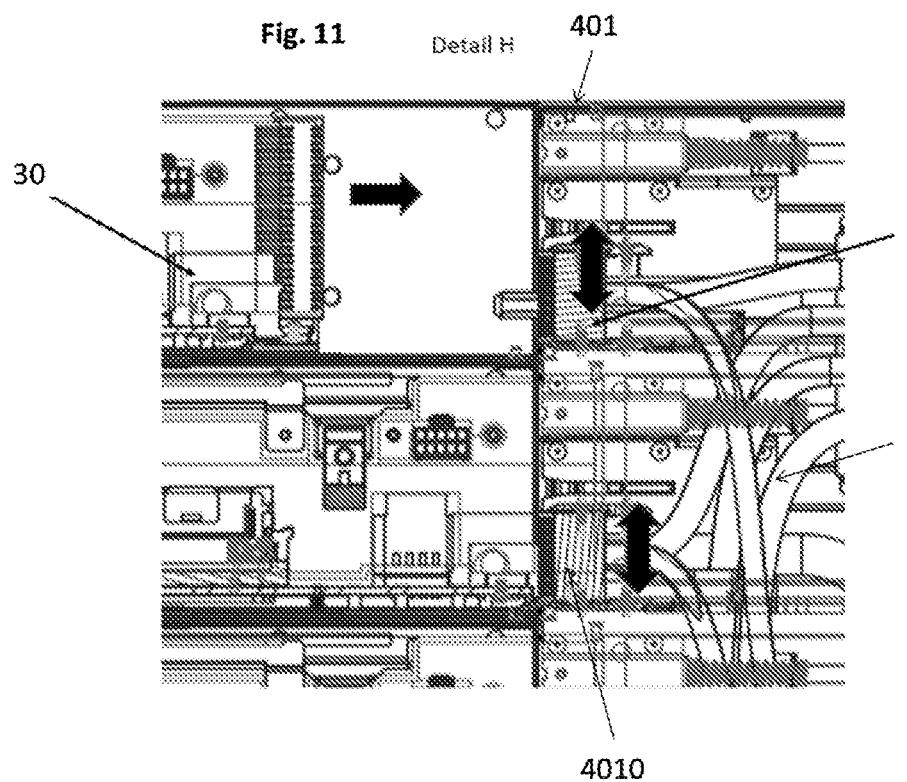

MECHANICAL SYSTEM FOR ENABLING SCALABLE SERVER SYSTEM

This application claims priority to European Patent Application Number 20199427.4, filed 30 Sep. 2020, the specification of which is hereby incorporated herein by reference.

BACKGROUND OF THE INVENTION

Field of the Invention

The invention relates to the field of High Performance Computer (HPC) field and scalable server systems.

Description of the Related Art

In the High Performance Computer (HPC) field, users expects servers to be highly reliable, and to have very low downtimes. Under such circumstances, most of the Companies who are in the (High Performance Computer) HPC field are searching to propose custom servers adapted to the specific needs of each user.

Hardware, software and firmware, sometimes referred to herein as "components" can be configured to per-form "cloud" and other types of computing functionality. Often, the components are installed into racks. For example, a server computer may have a rack-mountable chassis and installed into the said rack.

Conventional computer rack systems offer flexibility and modularity in configuring hardware to provide data networking, processing, and storage capacity. However, these servers and rack needs to be designed in factory. To scale a 2-socket to 4, 8 and so on requires expensive additional hardware like separate chassis to support additional motherboards. Entire server's hardware needs to be redesigned to build a 4-socket system or an 8-socket system and the set up needs to be done at the factory and then shipped to the customer site. Currently, if a customer wishes to upgrade to more sockets, they need to purchase an entirely new system.

Server systems generally provide a fixed number of options. For example, there are a fixed number of PCI Express 10 slots and a fixed number of hard drive bays, which often are delivered empty as they provide future upgradability. The customer is expected to gauge future needs and select a server chassis category that will serve present and future needs. Historically, and particularly with x86-class servers, predicting the future needs has been achievable because product improvements from one generation to another have been incremental. With the advent of scalable servers, the ability to predict future needs has become less obvious. For example, in the class of servers within a 2U chassis, it is possible to install 120 compute nodes in an incremental fashion. Using this server as a data storage device, the user may require only 4 compute nodes, but may desire 80 storage drives. Using the same server as a pure compute function focused on analytics, the user may require 120 compute nodes and no storage drives. The nature of scalable servers lends itself to much more diverse applications which require diverse system configurations. As the diversity increases overtime, the ability to predict the system features that must scale becomes increasingly difficult EP3254540 discloses an arrangement of a server chassis in a rack with easy replacement of said chassis. The arrangement is specifically designed to improve the effectiveness of the cooling system. The base can comprise ball bearing to reduce friction during translation of a wedge in or out said base. However, in this embodiment, it is still complicated to change the configuration of the system, as you need to replace a specific chassis by another one.

US20180192535 relates to a guide assembly in a chassis for the blind electrical connection between a previously mounted board and another one slid therein. In other words, a specific blind mate connector is used. However, this solution is difficult to implement in rack servers because of the need for alignment of the several elements in order for the blind electrical connection to work.

Thus, it remains a need for a simple way to propose easy maintenance and scalability in a server system.

BRIEF SUMMARY OF THE INVENTION

One or more embodiments of the invention therefore have an object of proposing a scalable system, giving the possibility of overcoming at least one portion of the drawbacks of the prior art.

One or more embodiments of the invention concerns a scalable system for high-power computer, comprising a plurality of motherboard chassis, for example server motherboard chassis, inserted in a computer rack, each motherboard chassis, called inner chassis, having front and rear longitudinal ends, being open at these ends, and being configured to receive at least one motherboard module comprising motherboard connectors, said module being inserted by a first longitudinal end, preferably front end, of the inner chassis, said plurality of inner chassis forming a stack of inner chassis, the stack being configured to receive an outer floating bracket chassis, said outer chassis being inserted by a second longitudinal end, preferably rear end, of each inner chassis forming the stack of inner chassis, each said outer floating bracket chassis being configured to accommodate at least one double floating bracket, said double floating bracket being configured to house a cable box capable of connecting the connectors of a plurality of motherboard modules, arranged in said inner chassis of the stack, to each other, wherein the double floating bracket comprises at least several floating attachment means comprising two different floating attachment means, the first floating attachment means being configured to guide the double floating bracket into the outer floating bracket chassis and align upward and downward each said bracket with an inner motherboard module chassis, the second floating attachment means being configured to align the cable connectors of the cables of said cable box with connectors of each of the motherboard modules.

Advantageously, one or more embodiments of the invention focus on how cable headers can be aligned to the motherboard connectors in adjacent multiple chassis stacked in a rack.

According to another particular feature, the floating attachment means consist of oblong holes which extend perpendicularly to an insertion axis of each chassis.

According to another particular feature, the outer floating bracket chassis comprises cooperating means with the floating attachment means of said chassis, for example a shoulder screw, to attach or fix the double floating bracket, and preferably also the cable box to said outer floating bracket chassis, in a floating manner.

According to another particular feature, each floating bracket and the floating bracket chassis comprise guiding grooves complementary to guiding ribs present on each inner motherboard module chassis.

According to another particular feature, the computer rack mounting kit comprises on its lateral sides, opposite to the sides for insertion of the motherboard module inner chassis and the floating bracket outer chassis, horizontal alignment means of the motherboard module inner chassis.

According to another particular feature, the horizontal alignment means of the inner chassis comprise alignment guides, one side of the computer rack mounting kit comprising long guides whose length is greater than those of the short guides which comprise the other side of the computer rack mounting kit.

According to another particular feature, each cable box comprises a front part and a rear part, the front part comprising front connectors of the cables, said connectors being configured to be connected with a plurality of motherboards or motherboard modules, for example two or more motherboard modules.

According to another particular feature, each cable box, the cable box comprising cables for connecting said cable box to other cable boxes in the outer chassis, and for connecting the cable box to the motherboards of different motherboard modules.

According to another particular feature, each cable box comprises a front portion and a rear portion, the rear portion comprising rear connectors adapted to connect the whole rack, or a part thereof, to additional devices.

According to another particular feature, the method for mounting a scalable server comprises at least the following steps:
Providing a computer rack mounting kit, preferably comprising horizontal alignment means of the motherboard module inner chassis,
Inserting at least one inner motherboard module chassis into said computer rack mounting kit from a first side, said chassis preferably being configured to be aligned by the alignment means,
Inserting a cable box into a double floating bracket, the box being secured to the bracket, preferably by shoulder screws fixed on said box,
Inserting at least one floating bracket containing a cable box into an outer floating bracket chassis, and then inserting said outer floating bracket chassis into the inner motherboard module chassis from a first side of said inner chassis,
inserting at least one motherboard module into said motherboard chassis from a second side opposite the first side of said chassis, the connection between the connectors of the backplane module and those of the cable box being achieved by the floating function of the floating fixing means of the floating bracket.

According to another particular feature, the order of the steps of inserting the floating bracket chassis and motherboard modules are reversed.

BRIEF DESCRIPTION OF THE DRAWINGS

Other features, details and advantages of the invention will become apparent upon reading the description which follows with reference to the appended figures, which illustrate:

FIG. 11 represents the detail H from the embodiment of FIG. 10 showing the connection between motherboard modules, for example compute eagle stream board in 2 Socket weldment, and the front cable connectors of cable box thanks to floating function B of dual floating UPI bracket.

DETAILED DESCRIPTION OF THE INVENTION

Figure 1:
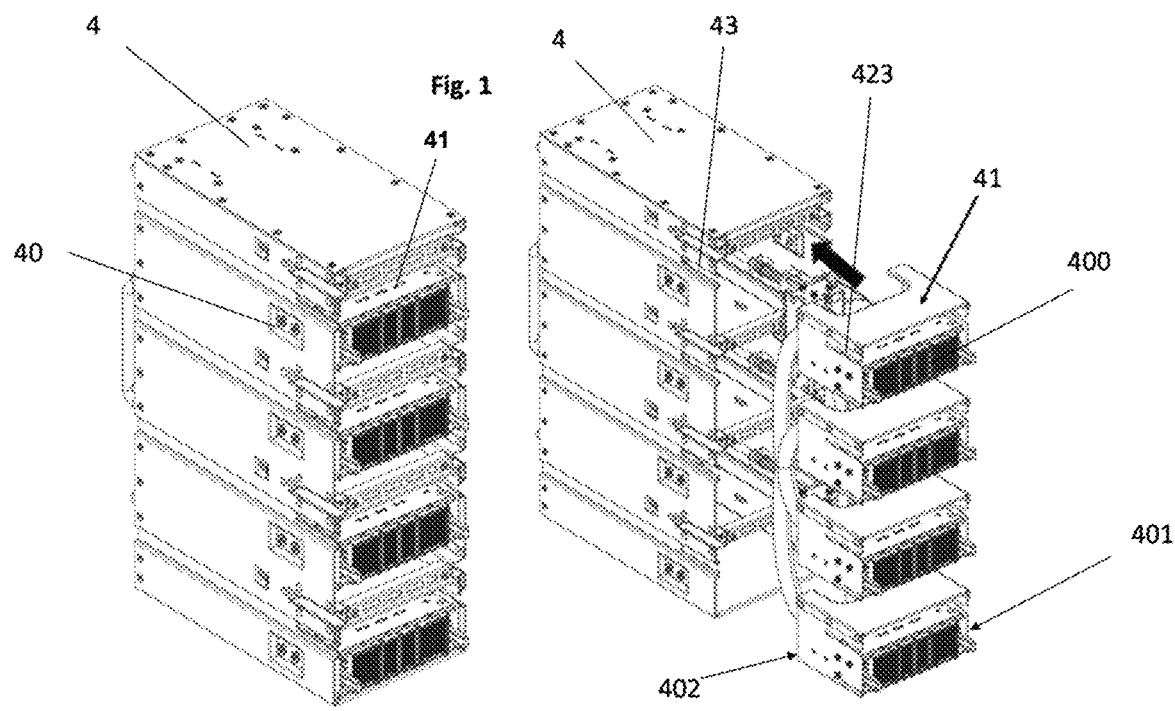
FIG. 1 illustrates dual floating bracket with 8-socket cable boxes, preferably forming Ultra Path Interconnect (UPI) links per CPU.

Many combinations can be envisaged without going beyond the scope of the invention; the person skilled in the art will choose one or the other according to the economic, ergonomic, dimensional or other constraints that he will have to respect.

One or more embodiments of the invention concern a scalable system (1) for high-power computer, comprising a plurality of motherboard chassis (3), for example server motherboard chassis, inserted in a computer rack mounting kit (2), each motherboard chassis (3), called inner chassis (3), having front and rear longitudinal ends, being open at these ends, and being configured to receive at least one motherboard module (30) comprising motherboard connectors, said module being inserted by a first longitudinal end of the inner chassis (3), said plurality of inner chassis forming a stack of inner chassis, the stack being configured to receive an outer floating bracket chassis (4, FIG. 2), said outer chassis (4) being inserted by a second longitudinal end of each inner chassis (3) forming the stack of inner chassis, each said outer floating bracket chassis (4) being configured to accommodate at least one double floating bracket (41), said double floating bracket (41) being configured to house a cable box (400) capable of connecting the connectors of a plurality of motherboard modules (30), arranged in said inner chassis (3) of the stack, to each other, wherein the double floating bracket (41) comprises at least several floating attachment means (420) comprising two different floating attachment means, the first floating attachment means (421, Function A) being configured to guide the double floating bracket (41) into the outer floating bracket chassis (4) and align upward and downward each said bracket (41) with an inner motherboard module chassis (3), the second floating attachment means (Function B) being configured to align the cable connectors (4010) of the cables (403) of said cable box (400) with connectors of each of the motherboard modules (30).

By "floating manner", in understood a relatively loose fixation, for example by oblong holes, allowing for small, preferably controlled movement. Advantageously oblong holes are a cheap and easy solution to allow floating controlled movement in a specific direction. Other solutions can include for example elastic or loose materials.

The present embodiments will be described with Ultra Path Interconnect (UPI) links per CPU, but embodiments of the invention could be implemented for PCIe or any other high-speed connection between computer nodes stacked in a rack.

In some embodiments, EXAMAX connectors are being used to supply the required speed (up to 56 GBps) for the UPI connections between the sockets. They have a combined mating force of 310N and total of 864 pins per motherboard.

Moreover, embodiments of the invention enable connection between separate chassis, up to 18 in number, placed adjacent to each other. One or more embodiments of the invention enable the automatic aligning of the chassis first and then the cables to the mother board connectors.

Advantageously, one or more embodiments of the invention enable the chassis in which the motherboard is mounted to be aligned before the connectors are mated to the cable. Hence, a 2-socket system can be converted to an 8, 16 or 32-socket system.

This system is purely scalable, as there is no need to take the motherboards back to the factory and fit them into different chassis and make the cable connections in the factory. One or more embodiments of the invention allow the convenient upgradability or scalability of the servers at the customer location because of the easy modification of the server configuration.

In some embodiments, the floating attachment means (420) consist of oblong holes which extend perpendicularly to an insertion axis of each chassis (3, 4).

In some embodiments, computer rack mounting kit (2) comprises on its lateral sides, opposite to the sides for insertion of the motherboard module inner chassis (3) and the floating bracket outer chassis (4), horizontal alignment means (20) of the motherboard module inner chassis (3).

In some embodiments, the horizontal alignment means (20) of the inner chassis (20) comprise alignment guides, one side of the computer rack mounting kit (2) comprising long guides (202) whose length is greater than those of the short guides (201) which comprise the other side of the computer rack mounting kit (2).

As a not limiting example, the computer rack mounting kit width could have a dimension of 450 mm with tolerance of +/−2 mm. Width-wise, the chassis can sit anywhere in this 4 mm tolerance space. In order to align the connectors of the motherboard to one side, a short rack guide is provided, for example in the left side and a taller one on the other side. It could have been short on right side as well and tall on left side.

The short guide on the computer rack mounting kit mounting mechanism pulls all the chassis to one side of the rack, leaving the tolerance space to play out on the other side of the rack. The taller rack guide on the right side allows the computer rack mounting kit width tolerance to play up or down the allowable +/−2 mm.

In some embodiments, each floating bracket (41) and the floating bracket chassis (4) comprise guiding grooves (423, 43) complementary to guiding ribs (31) present on each inner motherboard module chassis (3).

Advantageously, an alignment mechanism is provided thanks to guiding ribs (31), for example rails, on the inside of the motherboard chassis 3. This allows alignment of the stacked chassis (3) with the single cable box. Whether it is 4-socket box, an 8-socket box, or another number, the mechanism is the same. The grooves (43, 423) from both the floating bracket (41) and the outer chassis (4) align with the rails (31) fixing the alignment.

In some embodiments, as shown for example in FIG. 1, in a non-limitative way, the cable box (400) comprising front end connectors (4010) for connection with the motherboard connectors, is placed in the double floating bracket (41) forming a support. In some embodiments, the double floating bracket (41) comprising several cable boxes is then inserted in the outer floating bracket chassis (4), the plurality of cable boxes being aligned thanks to the first floating attachment means allowing first floating function (421, FIG. 2) of the floating attachment means (420) which cooperates with cooperating means, e.g. shoulders screws (40) present on the outer chassis (4), as shown by the FIG. 3, to fix in a floating manner, upward and downward, each dual socket bracket and cable box relative to the chassis (4), the floating movement preferably allowed by a pair of holes (421) present on the dual floating bracket (41) and a pair of oblong holes (4210) on the outer chassis (4)).

This dual floating system enables the connector to adjust at two levels—once with the cable box and motherboard board chassis, second with the board-to-board for connectors to mate. This dual level of engagement helps when there are large or inaccurate tolerances, like those that exist in a rack cabinet (+1-2 mm in comparison with the +/−0.2 mm required for cable mating)

Thus, in some embodiments, the outer floating bracket chassis (4) comprises cooperating means (40) with the floating attachment means (420) of said chassis, for example a shoulder screw, to attach or fix the double floating bracket (41), and preferably also the cable box (400) to said outer floating bracket chassis (4), in a floating manner.

In other embodiments, the oblong holes are present on the outer chassis (4), and the cooperating means, e.g. shoulder screws (40) are present on the dual floating bracket (41) or the cable boxes (400).

In some embodiments, there are 4 inner motherboard module chassis, (or servers) stacked one on top of each other in a rack. The cable box has a set of cables specifically designed to connect to all these 4 servers simultaneously. Each server has a motherboard (30) that in turn has 2 CPUs.

Figure 2:
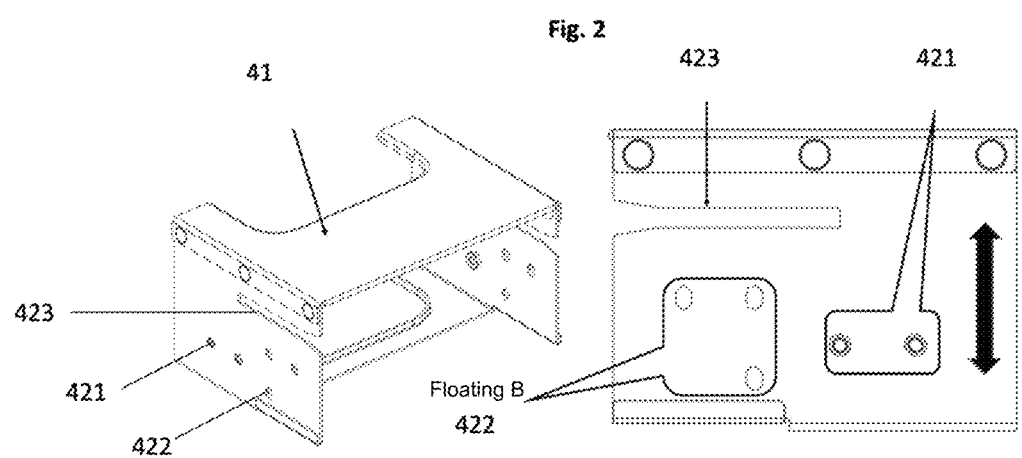
FIG. 2 represents on left view a perspective view of the details of dual floating bracket and on right part a side view of dual floating bracket provided with a first pair of holes enabling the first floating function A of the socket bracket for enabling an upward or downward movement between each dual socket bracket and socket chassis and cooperating to the double floating bracket function, and a second set of three obround holes enabling a second floating function B allowing alignment between the connector of each motherboard module and the front connectors of each socket cable box in the dual socket bracket.
Figure 3:
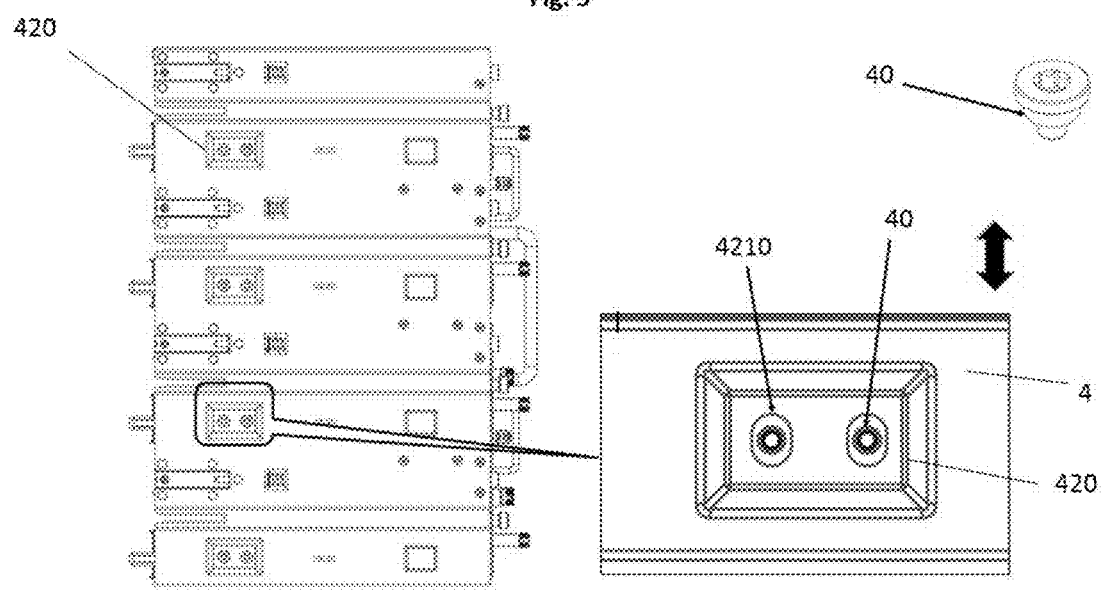
FIG. 3 represents the detail of floating function A using shoulder screw to fix a floating frame on the pair of holes of the dual floating bracket and cable box.
Figure 9:
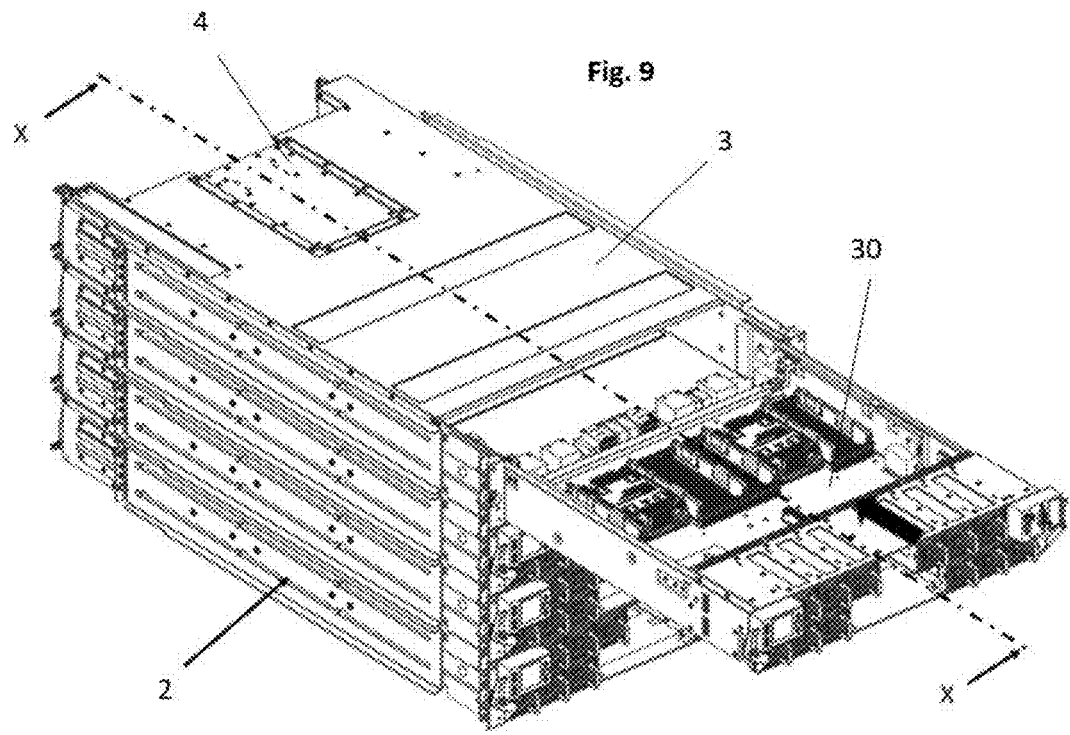
FIG. 9 illustrates a motherboard module (2 socket eagle stream module) inserted in an inner chassis according to an embodiment.

FIG. 2 shows details about the double floating bracket, which comprises guiding grooves (423) to cooperates with the guiding ribs (31; FIG. 9) of the inner motherboard module chassis (3), and the floating attachment means allowing first floating function by first floating attachment means (421), and second floating function by second floating attachment means (422). The first floating attachment means (421) enables an upward or downward movement between each dual socket bracket (41) and the socket chassis (4) comprising said brackets while the second floating attachment means (422) enables alignment and connection between motherboard modules (30), for example compute eagle stream board in 2-Socket weldment, and the front cable connectors of the cable box (400) in dual floating bracket. Indeed, the structure of these means allows the alignment guide pins attached cable headers 401 to the corresponding holes in the connectors on the eagle stream motherboard.

Figure 4:
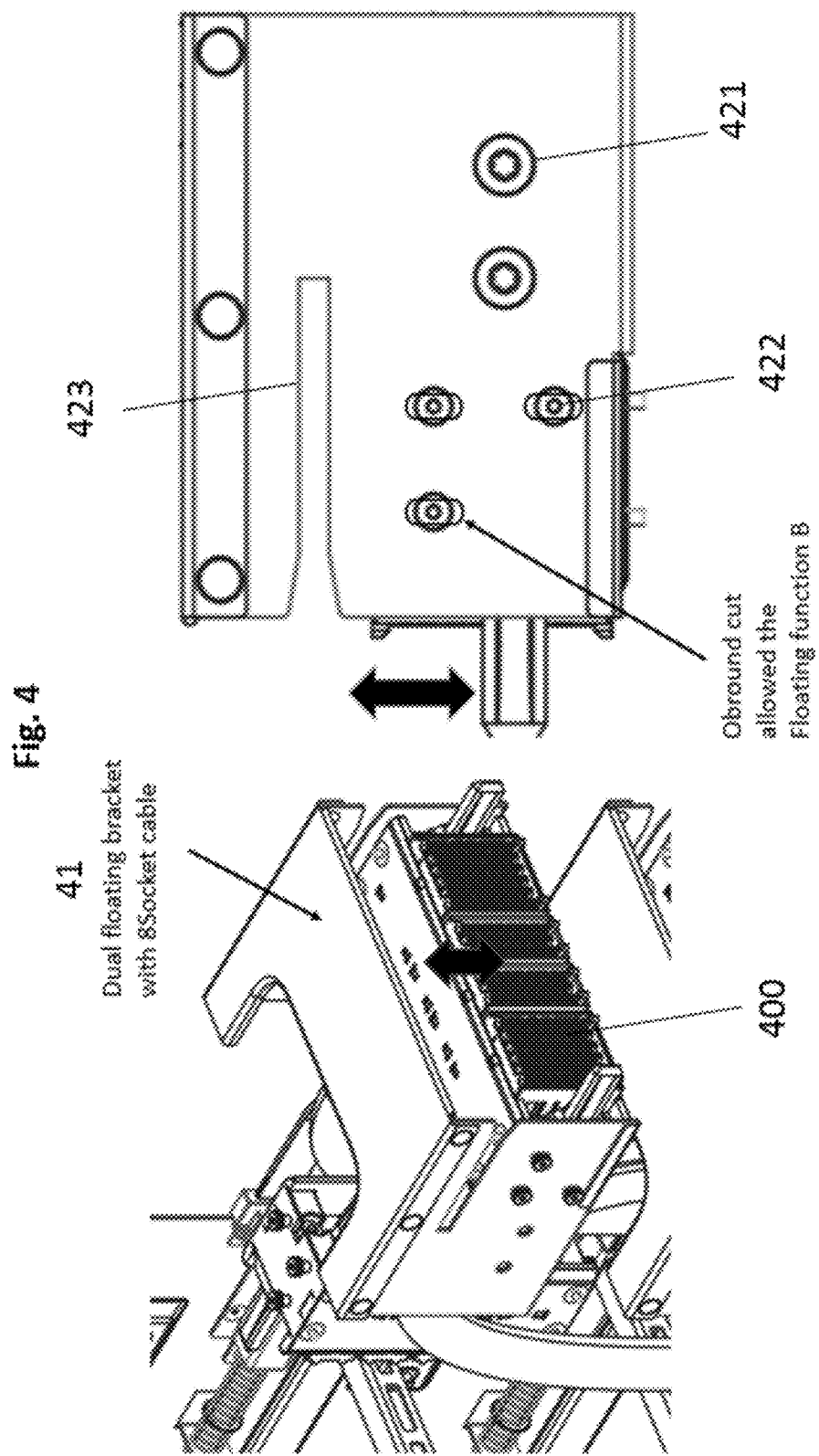
FIG. 4 further shows the mechanism of the floating attachment means according to an embodiment of the invention.

FIG. 4 further shows the floating attachment means. upward or downward floating is made possible by the presence of oblong holes that allows movement of the cable box inside the double floating bracket (41) only in an upward or downward manner. This way, the cable box can be aligned easily with said bracket and with other boxes, thanks to first floating function (421, function A), and also be aligned and connect easily with the connectors of the motherboard module thanks to second floating attachment means allowing second floating function. (422, Function B).

Advantageously, while function A aligns the rear cable box (400) to the chassis (3) and prepares the alignment of the function B to happen. Function B allows the cable connectors to float within the inner floating box (41) so that the guide pins in the cable headers are aligned to the connectors on the motherboard.

Figure 5:
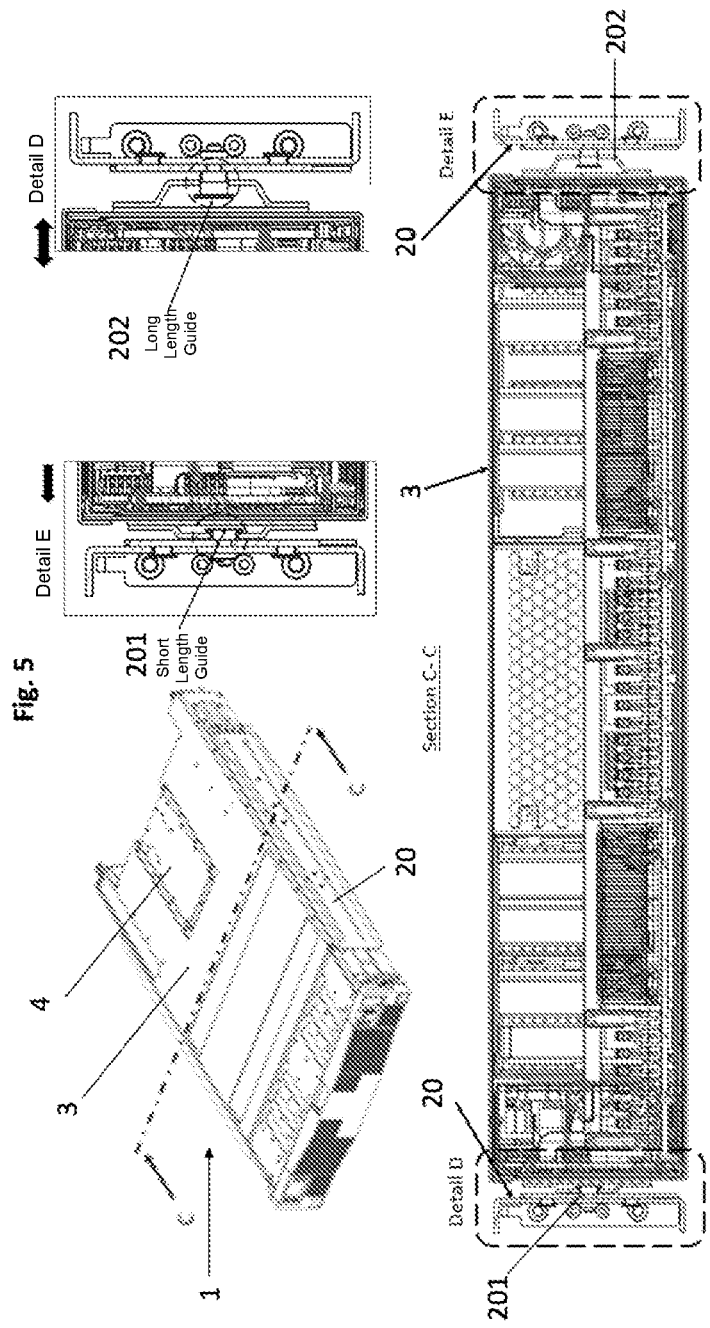
FIG. 5 illustrates the details of (a 2 CPU Socket) server in a housing mounted with horizontal alignment means, comprising alignment guides to align an inner chassis in the computer rack mounting kit of the scalable server.

FIG. 5 shows another feature of some embodiments. Indeed, the computer rack mounting kit in which inner motherboard module chassis (3) are placed comprises lateral alignment means (20) at its lateral sides. In some embodiments, one of the sides comprises at least a short guide (201) whereas the opposite lateral side comprises at least a long guide (202). Advantageously, this allows alignment of each inner motherboard module chassis (3) with the other ones of the stack formed in the computer rack mounting kit (2).

Figure 6:
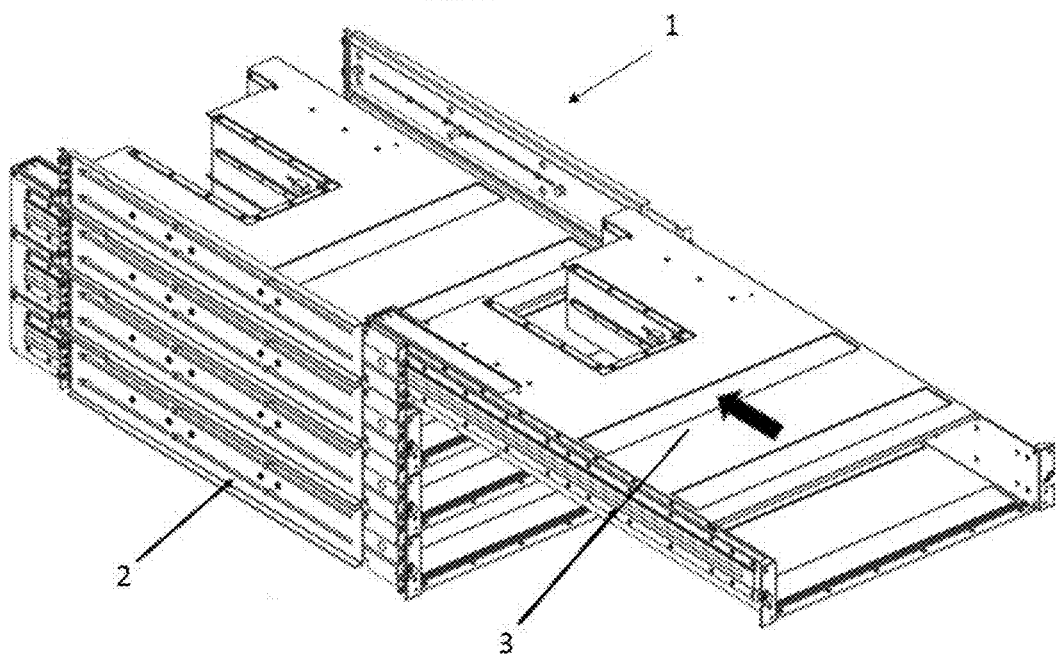
FIG. 6 illustrates the insertion of inner chassis in the computer rack mounting kit, according to an embodiment, forming a stack of inner chassis in said rack.

FIG. 6 shows the insertion of an inner motherboard module chassis (3) inside the computer rack mounting kit (2) to form a stack of inner motherboard module chassis (3). In this embodiment, the inner chassis (3) are inserted empty, but it is possible to insert them while they already contain motherboard module (30).

However, it is easier to insert the motherboards later, after the cable box is inserted into the empty stacked chassis (3) because for some connectors like the EXAMAX connectors, the mating forces of the connectors would be too high to push by hand, about 310N per motherboard, that will be about 1240N for the full 8-socket cable box.

Figure 7:
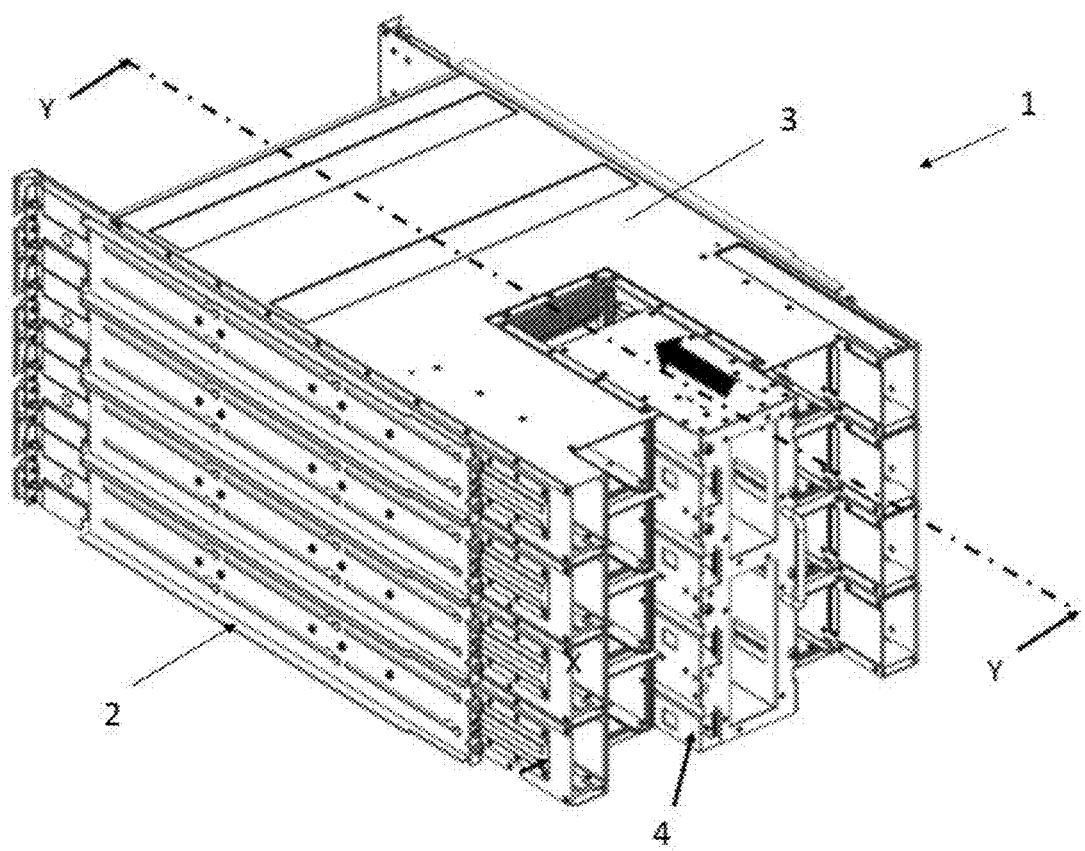
FIG. 7 illustrates the insertion of an outer chassis in the stack of inner chassis of FIG. 6 according to an embodiment.

FIG. 7 shows the stack of inner chassis (3) in the computer rack mounting kit (2) from another point of view, to show where and how the outer chassis (4) in inserted and connected with the plurality of inner chassis (3) in the computer rack mounting kit (2).

Figure 8:
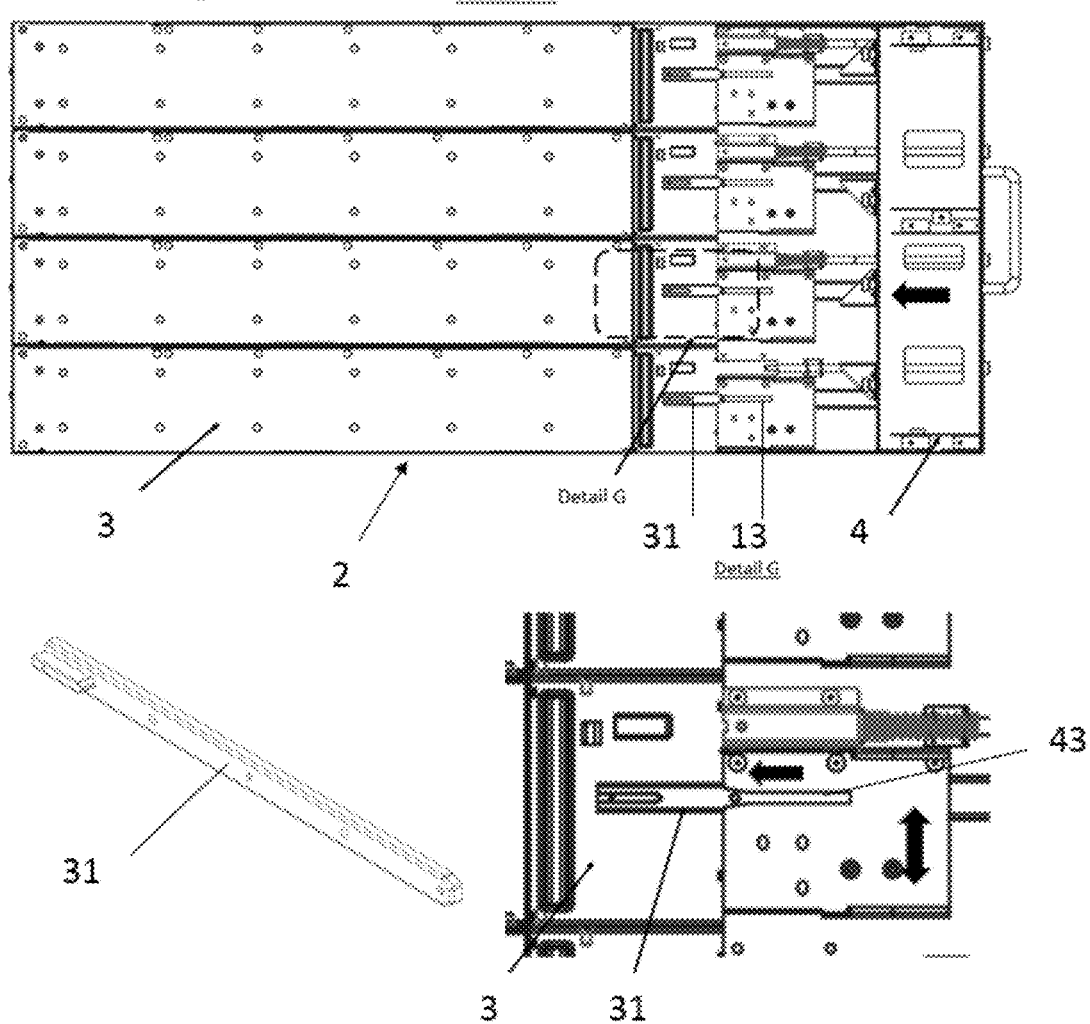
FIG. 8 represents a sectional view through the section Y-Y from the embodiment illustrated in FIG. 7.

FIG. 8 represents a sectional view through the section Y-Y from the FIG. 7. Particularly, it show at the detail G the guiding ribs (31) (or guiding rails) present on each of the inner chassis (3) that allows guiding of the outer chassis (4) during its insertion and connection to the inner chassis by cooperating with the guiding grooves (423, 43) of both the outer chassis (4) and the double floating bracket (41).

Figure 10:
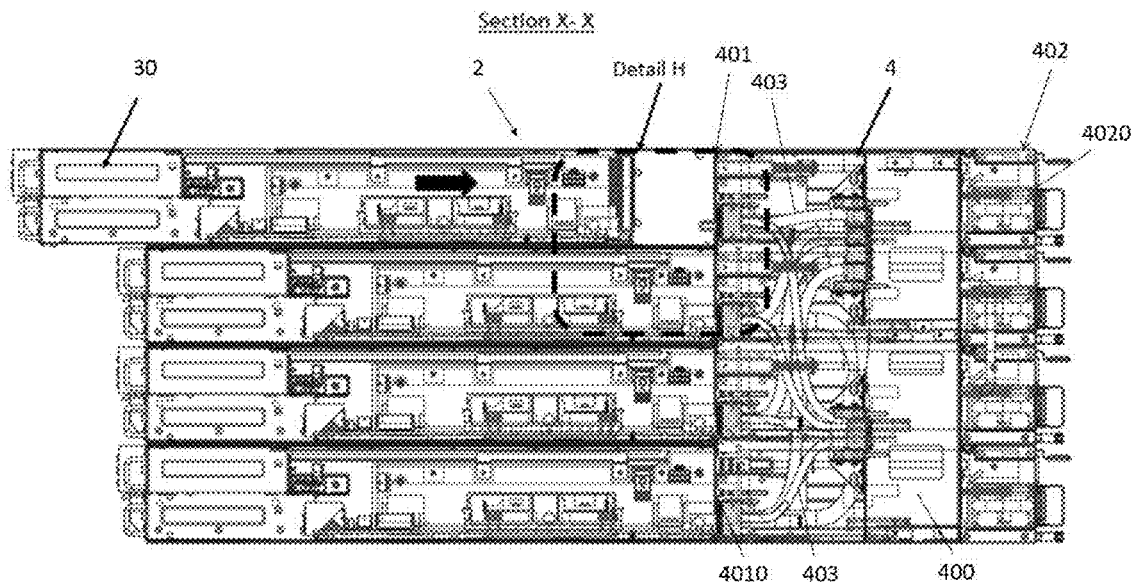
FIG. 10 represents a sectional view through axis X-X from the embodiment illustrated in FIG. 9.

FIG. 9 shows the computer rack mounting kit (2) comprising the stack of inner chassis assembled with the outer chassis (4), the inner chassis (3) each comprising a motherboard module comprising one or two CPU. The motherboard module is inserted and connected with the connector of the cable box (400) comprised in the floating bracket (41) itself placed in the outer chassis (4). A sectional view through axis X-X, as shown in FIG. 10, shows the inside of the computer rack mounting kit (2) when all the elements (chassis, bracket and cable box) are connected. Indeed, the cables (403) of the cable box (400) allow connection between the plurality of motherboard modules (30) and the plurality of cables boxes (400) to connect each CPU to the other ones. The connection is made by front connectors (4010) present at the front part (401) of the cable box (400) while the rear part (402) comprises rear connectors (4020) to connect the whole rack with other devices, for example another rack, PCIe boards and/or with networks.

In some embodiments, each cable box (400) comprises a front part (401) and a rear part (402), the front part (401) comprising front connectors (4010) of the cables (403), said connectors being configured to be connected with a plurality of motherboards or motherboard modules (30), for example two or more motherboard modules (30).

In some embodiments, each cable box (400), the cable box (400) comprising cables (403) for connecting said cable box to other cable boxes (400) in the outer chassis (4), and for connecting the cable box to the motherboards of different motherboard modules.

In some embodiments, each cable box comprises a front portion (401) and a rear portion (402), the rear portion (402) comprising rear connectors (4020) adapted to connect the whole rack, or a part thereof, to additional devices.

FIG. 11 is a detail "H" of the embodiment illustrated in FIG. 10 and shows the adaptable connection between the motherboard module (30) and the front connectors (4010) of the front part (401) of the cable box (400). The connection is made simpler thanks to the floating capacity of the front connectors (4010) due to the floating attachment means (420), and more particularly the second floating function operated by the second floating attachment means (422). Advantageously, manufacturing tolerance allows the motherboards to be slightly up or down. The function B aligns the connectors to this cable headers (4010) in the cable box (400). Thus, said front connectors (4010) can "float" namely can move vertically thanks to the floating attachment means (422), for example the shoulder screw (40) cooperating with the oblong holes (422), thus allowing connectors to perfectly adapt and match with each other.

In some embodiments, the connectors used are EXAMAX connectors. The EXAMAX connectors supply the required speed (up to 56 GBps) for the UPI connections between the sockets. They have a combined mating force of 310N and total of 864 pins per motherboard. As explained before, one or more embodiments of the invention enable connection between separate chassis, up to 18 in number, placed adjacent to each other. Also, one or more embodiments of the invention enable the automatic aligning of the chassis first and then the cables to the motherboard connectors.

In some embodiments, the method for mounting a scalable server comprises at least the following steps:

Providing a computer rack mounting kit (2), preferably comprising horizontal alignment means (20) of the motherboard module inner chassis (3), Inserting at least one inner motherboard module chassis (3) into said computer rack mounting kit (2) from a first side, said chassis preferably being configured to be aligned by the alignment means, Inserting a cable box (400) into a double floating bracket (41), the box being secured to the bracket, preferably by shoulder screws (40) fixed on said box (400), Inserting at least one floating bracket (41) containing a cable box (40) into an outer floating bracket chassis (4), and then inserting said outer floating bracket chassis (4) into the inner motherboard module chassis (3) from a first side of said inner chassis (3), inserting at least one motherboard module (30) into said motherboard chassis (3) from a second side opposite the first side of said chassis (3), the connection between the connectors of the backplane module (30) and those of the cable box being achieved by the floating function of the floating attachment means (420) of the floating bracket (41).

One of the currently described and used Amphenol Examax connectors have 800+ pins having a force of over 310N per motherboard. For 4 motherboards modules (30), this is more than 1200N. So, first the empty chassis (3) are inserted and stacked in the rack. The computer rack mounting kit mounting guides is used to align the chassis (3) to one side. Then the cable box (400) are inserted in the rear via the outer chassis (4), allowing the function A to align the cable box (400) to the chassis (3). Finally, the motherboard modules (30) are inserted in the chassis (3) hence aligning the cable headers (4010) to the connectors in the motherboard rear side.

In some embodiments of the method, the order of the steps of inserting the floating bracket chassis (4) and motherboard modules (30) are reversed.

It will be easily understood upon reading the present application that the particularities of the present invention, as generally described and illustrated in the figures, may be arranged and designed according to a great variety of different configurations. Thus, the description of the present invention and the related figures are not provided for limiting the scope of the invention but simply illustrating selected embodiments.

One skilled in the art will understand that the technical features of a given embodiment may in fact be combined with features of another embodiment unless the opposite is explicitly mentioned or if it is obvious that these features are incompatible. Further, the technical features described in a given embodiment may be isolated from the other features of this embodiment unless the opposite is explicitly mentioned.

It should be obvious for persons skilled in the art that the present invention allows embodiments under many other specific forms without departing from the field defined by the scope of the appended claims, these embodiments should be considered as an illustration and the invention should not be limited to the details given above.

LIST OF REFERENCE SIGNS

1. Scalable system
2. Computer rack mounting kit
20. Horizontal alignment means
201. Short guide
202. Long guide
3. Inner motherboard module chassis
30. Motherboard Module
31. Guiding ribs
4. Outer floating bracket chassis
40. Cooperating means
41. Double floating bracket
420. Floating attachment means
421. First floating function (first floating attachment means)
4210. Oblong holes on the outer chassis
422. Second floating function (second floating attachment means)
423. Guiding grooves
43. Guiding grooves
400. Cable box
401. Front part of the cable box
4010. Front connectors
402. Rear part of the cable box
4020. Rear connectors
403. Cables

What is claimed is:

1. A scalable system for a high-performance computer, comprising:
    a plurality of inner chassis inserted in a computer rack mounting kit;
    wherein each inner chassis of said plurality of inner chassis comprising front longitudinal ends and rear longitudinal ends, wherein said each inner chassis is open at said front longitudinal ends and said rear longitudinal ends, and
    configured to receive at least one motherboard module comprising motherboard connectors, said at least one motherboard module being inserted by a first longitudinal end of said front longitudinal ends and said rear longitudinal ends of said each inner chassis;
    wherein said plurality of inner chassis form a stack of inner chassis, wherein the stack of inner chassis is configured to receive an outer floating bracket chassis, and wherein said outer floating bracket chassis is inserted by a second longitudinal end of said front longitudinal ends and said rear longitudinal ends of said each inner chassis forming the stack of inner chassis;
    wherein said outer floating bracket chassis houses a cable box, wherein said cable box is configured to connect the motherboard connectors of a plurality of motherboard modules arranged in the stack of inner chassis to each other, and wherein said outer floating bracket chassis accommodates at least one double floating bracket that houses cable connectors of cables of said cable box;
    wherein each double floating bracket of said at least one double floating bracket comprises floating attachment means comprising
        a first floating attachment means configured to guide said each double floating bracket in the outer floating bracket chassis by aligning upward and downward said each double floating bracket with an inner chassis of said plurality of inner chassis; and
        a second floating attachment means configured to align the cable connectors of the cables of said cable box with the motherboard connectors of each of the plurality of motherboard modules.

2. The scalable system for a high-performance computer according to claim 1, wherein the floating attachment means consist of oblong holes which extend perpendicularly to an insertion axis of each chassis.

3. The scalable system for a high-performance computer according to claim 2, wherein the outer floating bracket chassis comprises cooperating means with the floating attachment means of said outer floating bracket chassis, to attach or fix said each double floating bracket and the cable box to said outer floating bracket chassis, in a floating manner.

4. The scalable system for a high-performance computer according to claim 1, wherein each floating bracket of said at least one double floating bracket and the outer floating bracket chassis comprise guiding grooves complementary to guiding ribs present on each inner motherboard module chassis of said at least one motherboard module.

5. The scalable system for a high-performance computer according to claim 1, wherein the computer rack mounting kit comprises lateral sides that are opposite to sides for insertion of the each inner chassis and the outer floating bracket chassis, and horizontal alignment means of the each inner chassis on said lateral sides.

6. The scalable system for a high-performance computer according to claim 5, wherein the horizontal alignment means of the inner chassis comprise alignment guides, with one side of said lateral sides of the computer rack mounting kit comprising long guides whose length is greater than those of short guides on another side of the lateral sides of the computer rack mounting kit.

7. The scalable system for a high-performance computer according to claim 1, wherein said cable box comprises a front part and a rear part, the front part comprising front connectors of the cables, said front connectors being configured to be connected with a plurality of motherboards or said plurality of motherboard modules.

8. The scalable system for a high-performance computer according to claim 1, wherein said cables of said cable box connect said cable box to other cable boxes in the outer floating bracket chassis, and connect the cable box to motherboards of different motherboard modules of said plurality of motherboard modules.

9. The scalable system for a high-performance computer according to claim 8, wherein said cable box comprises a front portion and a rear portion, the rear portion comprising rear connectors adapted to connect all or a part of the computer rack mounting kit to additional devices.

10. A method for mounting a scalable system for a high-performance computer, said scalable system for said high-performance computer comprising
   a plurality of inner chassis inserted in a computer rack mounting kit;
   wherein each inner chassis of said plurality of inner chassis comprising front longitudinal ends and rear longitudinal ends, wherein said each inner chassis is open at said front longitudinal ends and said rear longitudinal ends, and
   configured to receive at least one motherboard module comprising motherboard connectors, said at least one motherboard module being inserted by a first longitudinal end of said front longitudinal ends and said rear longitudinal ends of said each inner chassis;
   wherein said plurality of inner chassis form a stack of inner chassis, wherein the stack of inner chassis is configured to receive an outer floating bracket chassis, and wherein said outer floating bracket chassis is inserted by a second longitudinal end of said front longitudinal ends and said rear longitudinal ends of said each inner chassis forming the stack of inner chassis;
   wherein said outer floating bracket chassis houses a cable box, wherein said cable box is configured to connect the motherboard connectors of a plurality of motherboard modules arranged in the stack of inner chassis to each other, and wherein said outer floating bracket chassis accommodates at least one double floating bracket that houses cable connectors of cables of said cable box;
   wherein each double floating bracket of said at least one double floating bracket comprises floating attachment means comprising
      a first floating attachment means configured to guide said each double floating bracket in the outer floating bracket chassis by aligning upward and downward said each double floating bracket with an inner chassis of said plurality of inner chassis; and
      a second floating attachment means configured to align the cable connectors of the cables of said cable box with the motherboard connectors of each of the plurality of motherboard modules;
   said method comprising:
   providing said computer rack mounting kit;
   inserting at least one inner chassis of said plurality of inner chassis into said computer rack mounting kit from a first side of the computer rack mounting kit;
   inserting said cable box into said each double floating bracket, the cable box being secured to the each double floating bracket;
   inserting the each double floating bracket containing the cable box into the outer floating bracket chassis, and then inserting said outer floating bracket chassis into the at least one inner chassis from a first side of said at least one inner chassis,
      wherein the first floating attachment means guides the each double floating bracket in the outer floating bracket chassis by aligning upward and downward said each double floating bracket with said inner chassis of said at least one inner chassis; and,
   inserting said at least one motherboard module into said inner chassis from a second side opposite to the first side of said inner chassis, wherein the second floating attachment means aligns said cable connectors of the cables of said cable box with said motherboard connectors of each of the at least one motherboard module.

11. The method according to claim 10, wherein said inserting the outer floating bracket chassis and said inserting said at least one motherboard module is performed in a reverse order.

* * * * *